(12) United States Patent
Ma et al.

(10) Patent No.: US 9,230,956 B2
(45) Date of Patent: Jan. 5, 2016

(54) JUNCTION FIELD EFFECT TRANSISTORS AND ASSOCIATED FABRICATION METHODS

(71) Applicant: Chengdu Monolithic Power Systems Co., Ltd., Chengdu (CN)

(72) Inventors: Rongyao Ma, Chengdu (CN); Tiesheng Li, San Jose, CA (US); Lei Zhang, Chengdu (CN); Daping Fu, Chengdu (CN)

(73) Assignee: Chengdu Monolithic Power Systems, Inc., Chengdu (CN)

( * ) Notice: Subject to any disclaimer, the term of this patent is extended or adjusted under 35 U.S.C. 154(b) by 59 days.

(21) Appl. No.: 14/066,626

(22) Filed: Oct. 29, 2013

(65) Prior Publication Data

US 2014/0117415 A1 May 1, 2014

(30) Foreign Application Priority Data

Oct. 30, 2012 (CN) .......................... 2012 1 0422691

(51) Int. Cl.
*H01L 27/06* (2006.01)
*H01L 27/146* (2006.01)
*H01L 27/098* (2006.01)

(52) U.S. Cl.
CPC .......... *H01L 27/0617* (2013.01); *H01L 27/098* (2013.01); *H01L 27/14679* (2013.01)

(58) Field of Classification Search
CPC ..................... H01L 29/66893; H01L 29/7832; H01L 27/0617; H01L 27/1467
See application file for complete search history.

(56) References Cited

U.S. PATENT DOCUMENTS

| 5,917,216 A * | 6/1999 | Floyd et al. .................... 257/330 |
| 2003/0011027 A1 * | 1/2003 | Zeng et al. ..................... 257/329 |

\* cited by examiner

*Primary Examiner* — Victor A Mandala
*Assistant Examiner* — Quovaunda V Jefferson
(74) *Attorney, Agent, or Firm* — Perkins Coie LLP

(57) ABSTRACT

A JFET having a semiconductor substrate of a first doping type, an epitaxial layer of the first doping type located on the semiconductor substrate, a body region of a second doping type located in the epitaxial layer, a source region of the first doping type located in the epitaxial layer, a gate region of the second doping type located in the body region, and a shielding layer of the second doping type located in the epitaxial layer, wherein the semiconductor substrate is configured as a drain region, the shielding layer is in a conductive path formed between the source region and the drain region.

20 Claims, 4 Drawing Sheets

JUNCTION FIELD EFFECT TRANSISTORS AND ASSOCIATED FABRICATION METHODS

CROSS-REFERENCE TO RELATED APPLICATION

This application claims the benefit of CN application No. 201210422691.5, field on Oct. 30, 2012, and incorporated herein by reference.

TECHNICAL FIELD

The present invention generally relates to semiconductor technology, and more particularly but not exclusively relates to junction field effect transistors and associated fabrication methods.

BACKGROUND

FIG. 1 illustrates a cross-sectional view of a prior art N-channel junction field effect transistor (JFET) 100. The JFET is a vertical device and it comprises an N+ drain region 101 (generally as a semiconductor substrate), an N− epitaxial layer 102 located on the N+ drain region 101, a P body region 103 located in the N− epitaxial layer 102, an N+ source region 104 located in the N− epitaxial layer 102 and surrounded by the P body region 103, and a P+ gate region 105 located in the P body region 103. The JFET further comprises an interlayer dielectric layer (ILDL) 106, a source contact 107 and a gate contact 108. The source contact 107 extends through the ILDL 106 and provides electrical connection with the N+ source region 104. The gate contact 108 extends though the ILDL 106 and provides electrical connection with the P+ gate region 105. The N+ source region 104 is located in a part of the N− epitaxial layer 102 which is surrounded by the P body region 103. The part of the N− epitaxial layer 102 extends from the N+ source region 104 towards the N+ drain region 101, so as to form a conductive path.

When a bias voltage is applied to the gate contact 108, the P body region 103 will produce a pinch-off effect, so the current flowing through the conductive path can be controlled. As shown in FIG. 1, a label "A" is used to illustrate the pinch-off region generated in the N− epitaxial layer 102. Generally, in order to enhance the pinch-off effect, the width of the pinch-off region A should be set as small as possible and therefore a desired low pinch-off voltage can be achieved. However, this reduces the width of the conductive path, while increases the on-resistance. In addition, this also reduces the distance between the source region 104 and the gate region 105 and results in a low gate-source breakdown voltage. Besides, an optical lithography with higher resolution may be needed and the fabrication process may become more complicated.

Thus, it would be desired to reduce the pinch-off voltage while keeping the source region 104 far away from the gate region 105.

SUMMARY

One embodiment of the present invention discloses a JFET, the JFET comprising: a semiconductor substrate of a first doping type, wherein the semiconductor substrate is configured as a drain region; an epitaxial layer of the first doping type located on the semiconductor substrate; a body region of a second doping type located in the epitaxial layer, wherein the second doping type is different from the first doping type; a source region of the first doping type located in the epitaxial layer; a gate region of the second doping type located in the body region; and a shielding layer of the second doping type located in the epitaxial layer, wherein the shielding layer is in a conductive path formed between the source region and the drain region.

The embodiments of the present invention produce new pinch-off region in the JFET by adding a shielding layer to enhance the pinch-off effect. So, the pinch-off voltage is reduced while the distance between the source region and the gate region is maintained. In addition, a high gate-source breakdown voltage and a low on-resistance can be achieved. Thus the design of the JFET can be simple since there does not need a tradeoff in performance.

BRIEF DESCRIPTION OF THE DRAWINGS

Non-limiting and non-exhaustive embodiments are described with reference to the following drawings. The drawings are not depicted to scale and only for illustration purpose, wherein like reference labels in different drawings indicate same or like components.

DETAILED DESCRIPTION

Reference will now be made in detail to the preferred embodiments of the invention, examples of which are illustrated in the accompanying drawings. In some instances, well known structures and functions have not been shown or described in detail to avoid unnecessarily obscuring the description of the embodiments of the technology. In some instances, similar structures and functions that have been described in detail for other embodiments are not been described in detail for such embodiments to simplify and make clear understanding of the embodiments. It is intended that the terminology used in the description presented below be interpreted in its broadest reasonable manner, even though it is being used in conjunction with a detailed description of certain embodiments of the technology.

Figure 2:
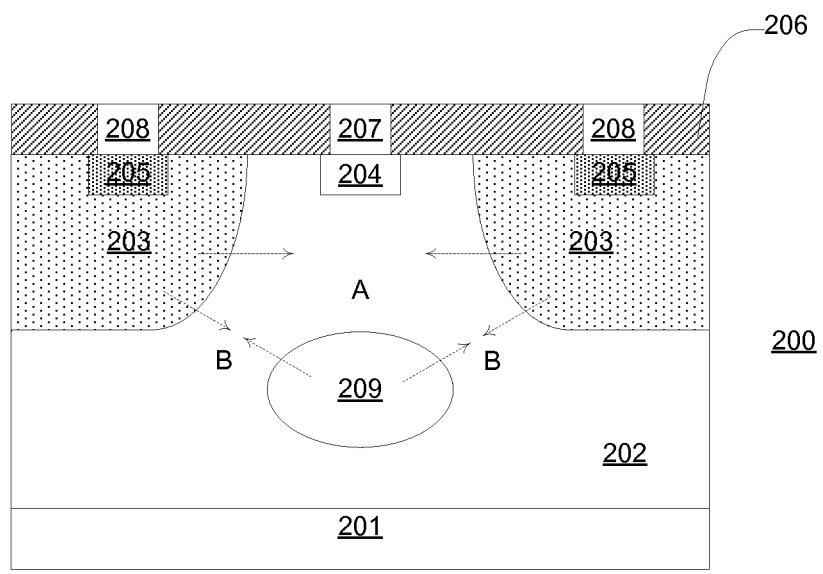
FIG. 2 illustrates a cross-sectional view of a JFET 200 according to an embodiment of the present invention.

FIG. 2 illustrates a cross-sectional view of a JFET 200 according to an embodiment of the present invention. The JFET 200 comprises an N+ drain region 201 generally functioning as a semiconductor substrate, an N− epitaxial layer 202 located on the N+ drain region 201, a P body region 203 located in the N− epitaxial layer 202, an N+ source region 204 located in the N− epitaxial layer 202 and surrounded by the P body region 203, and a P+ gate region 205 located in the P body region 203. In the embodiment shown in FIG. 2, the JFET 200 further comprises an interlayer dielectric layer (ILDL) 206, a source contact 207 and a gate contact 208. The source contact 207 extends through the ILDL 206 and provides electrical connection with the N+ source region 204. The gate contact 208 extends through the ILDL 206 and provides electrical connection with the P+ gate region 205. The N+ source region 204 is located in a part of the N– epitaxial layer 202 which is surrounded by the P body region 203. The part of the N– epitaxial layer 202 extends from the N+ source region 204 towards the N+ drain region 201, so as to form a conductive path. The JFET 200 shown in FIG. 2 is a vertical device.

Figure 1:
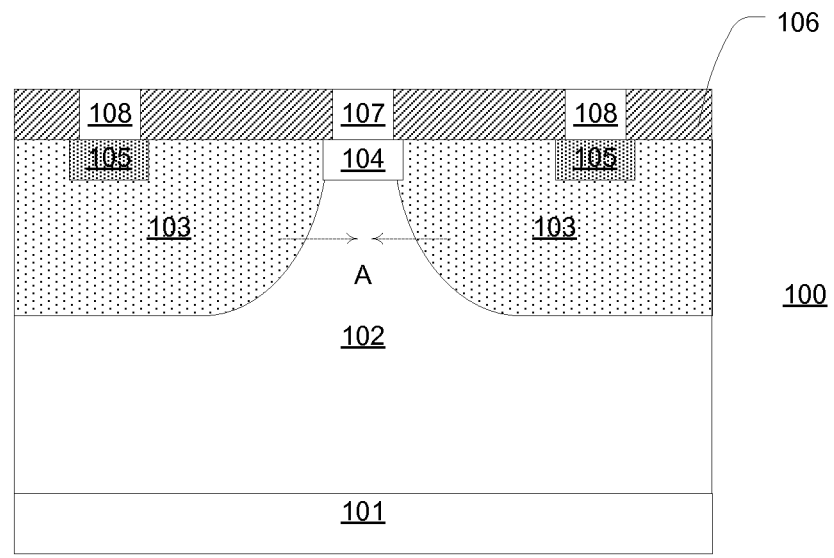
FIG. 1 illustrates a cross-sectional view of a prior art N-channel region JFET 100.

As shown in FIG. 2, the structure of the JFET 200 is different from that of the JFET 100 shown in FIG. 1. A difference is that JFET 200 further comprises a P shielding layer 209. The P shielding layer is located in the conductive path formed between the source region 204 and the drain region 201.

When a bias voltage is applied to the gate contact 208, the P body region 203 and the P shielding layer 209 will produce the pinch-off effect together. The pinch-off region can now be regarded as consisting of two regions: region A and region B. Region B is located between the body region 203 and the shielding layer 209. The shielding layer 209 is also used to at least partially reduce the electrical field of the region A. Even though the distance between the source region 204 and the gate region 205 does not change, the effective width of the pinch-off region is reduced due to the existence of the shielding layer 209, and thus the pinch-off effect is enhanced.

The P shielding layer 209 may be formed by high-energy implant of P-type dopants into the N-type epitaxial layer 202. The depth of the P shielding layer 209 is determined by the distance between the shielding layer 209 and the body region 203. The smallest distance should be small enough so the pinch-off region B can be formed. In a preferred embodiment, the shielding layer 209 is at least partially above the bottom of the body region 203. On the other hand, the width of the P shielding layer 209 is also determined by the distance between the shielding layer 209 and the body region 203. The smallest distance should be large enough to prevent breaking the conductive path due to the contact between the two regions 209 and 203. In a preferred embodiment, the width of the shielding layer 209 is same with the top width of the conductive path. As shown in FIG. 2, in the N– epitaxial layer 202, the conductive path is defined by the P body region 203. Its top width is the smallest due to the doping profile of the body region 203. The cross-sectional profile of the shielding layer 209 is determined by the mask used in the fabrication process. In a preferred embodiment, the cross-sectional profile of the shielding layer 209 is same with the top-sectional profile of the conductive path and is complementary to the top-sectional profile of the body region 203. In one embodiment, the cross-sectional profile of the shielding layer 209 is consistent with the profile of the active area of the JFET 200. For example, when the former one is square, the latter one is also square. When the former one is circular, the latter one is also circular. This helps to control the smallest distance between the shielding layer 209 and the body region 203.

In one embodiment, the N+ drain region 201 of the JFET 200 is formed by a highly doped semiconductor substrate. In one embodiment, the N– epitaxial layer 202 comprises an epitaxial semiconductor layer located on the semiconductor substrate. The semiconductor material used to form the semiconductor substrate or the epitaxial semiconductor layer may comprise gallium arsenide (GaAs), indium phosphide (InP), gallium nitride (GaN), silicon carbide (SiC), silicon (Si) and germanium (Ge). In a preferred embodiment, compounds such as silicon germanium (binary compound), SiC (particularly for high voltage applications) and Germanium nitride (GeN) may be used to form the semiconductor substrate or the epitaxial semiconductor layer.

In one embodiment, the P body region 203 is formed through ion implantation, e.g. implanting P type dopants (such as boron) into the N– epitaxial layer 202. In one embodiment, the dopants may be implanted via ion bombardment.

In one embodiment, the N+ source region 204 is formed through ion implantation, e.g. implanting N type dopants (such as arsenic, phosphorus or antimony) into the N– epitaxial layer 202.

In one embodiment, further implantation of P type dopants (such as boron) forms the P+ gate region 205 in the P body region 203.

In one embodiment, the ILDL 206 comprises silicon oxide. The ILDL 206 may be formed through any method known in the art, such as thermally grown, deposited, etc.

In one embodiment, the source contact 207 and the gate contact 208 comprise tungsten. The metal contacts may be formed through any method known in the art, such as filling the through-via of ILDL 206 with metal material.

In one embodiment, the P body region 203 forms an annular region. A part of the N– epitaxial layer 202 is surrounded by the P body region 203, and thereby forms at least a part of the conductive path between the source region 204 and the drain region 201.

Some specific size features will be described below for purpose of illustration, but one skilled in the art should understood that it is not intended to limit the scope of the present invention. In other embodiments, the present invention may also adopt other suitable size feature.

The thickness of the ILDL 206 is related to the voltage class of the JFET and is adjustable with various voltage requirements. In one embodiment, the thickness of the ILDL 206 is set to a minimum value while the required voltage of the JFET is maintained. The thickness of the ILDL 206 increases with the increasing required voltage. In one embodiment, the ILDL 206 comprises an oxide layer.

In one embodiment, the thickness of the N+ source region 204 is about 0.1 μm~2 μm. The thickness of the N+ source region 204 is not only related to the required breakdown voltage of the JFET 200, but also related to the fabrication material of the N+ source region 204. In one embodiment, the thickness of the N+ source region 204 is about 0.25 μm.

Figure 3:
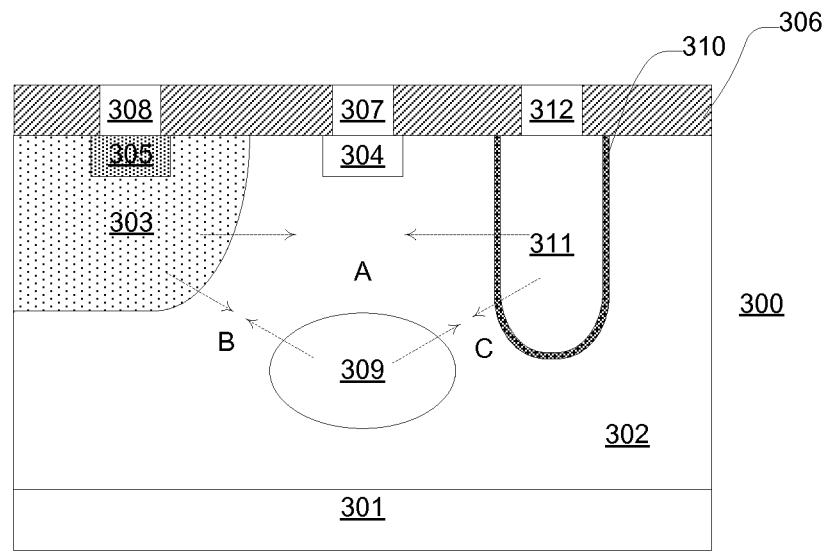
FIG. 3 illustrates a cross-sectional view of a JFET 300 according to another embodiment of the present invention.

FIG. 3 illustrates a cross-sectional view of a JFET 300 according to another embodiment of the present invention. As shown in FIG. 3, the structure of the JFET 300 is similar to that of the JFET 200 shown in FIG. 2. The difference is that the JFET 300 further comprises a trench formed in the N– epitaxial layer 302. A gate dielectric layer 310, such as HfO2, is formed on the sidewalls of the trench, and the trench is filled with gate conductor 311 such as doped polysilicon. The JFET 300 further comprises a gate contact 312 except for the previous gate contact 308. The gate contact 312 extends through the ILDL 306 and produces electrical connection to the gate conductor 311. The gate conductor 311 is also called trench gate.

When same or different bias voltages are applied to the gate contacts 308 and 316, the body region 303, the gate conductor 311 and the shielding layer 309 will produce the pinch-off effect together. The pinch-off region can now be regarded as consisting of three regions: region A, region B and region C. Region A is located between the body region 303 and the gate conductor 311, region B is between the body region 303 and the shielding layer 309, and region C is between the shielding layer 309 and the gate conductor 311. Furthermore, the shielding layer 309 at least partially reduces the electrical field of the region A.

Similar with the JFET 200 shown in FIG. 2, the depth and width of the shielding layer 309 are determined by the smallest distances between the shielding layer 309 and the body region 303 as well as that between the shielding layer 309 and the gate conductor 311. This allows the production of regions B and C without breaking the conductive path.

In one embodiment, the gate conductor 311 is located in the center of the active area. The P body region 303 is annular and concentric with the gate conductor 311. A part of the N− epitaxial layer 302 is surrounded by the P body region 303, and forms at least a part of the conductive path formed between the source region 304 and the drain region 301.

Figure 4:
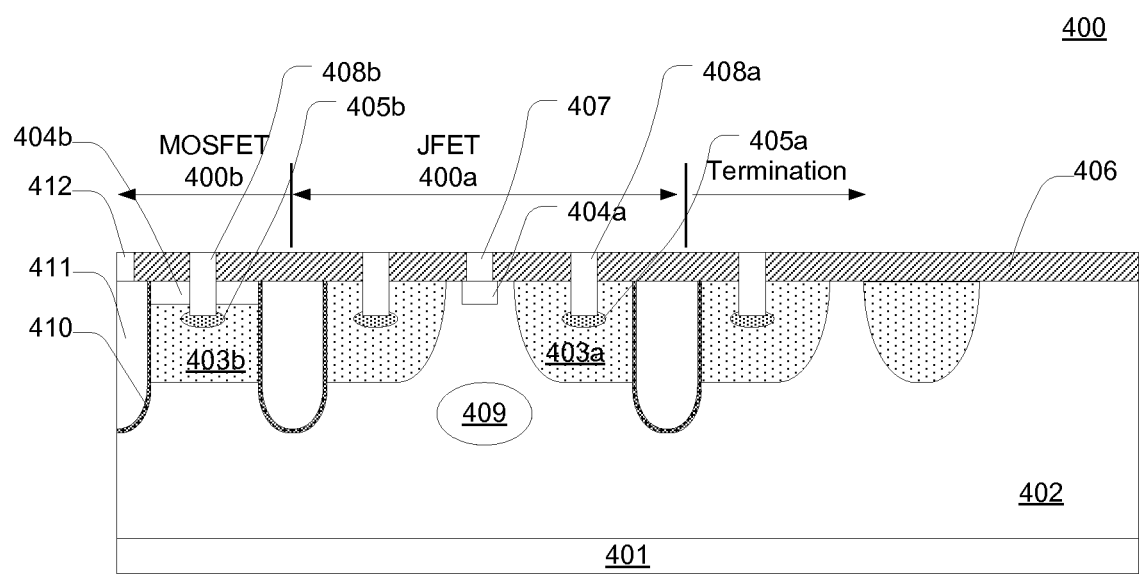
FIG. 4 illustrates a cross-sectional view of a semiconductor device 400 integrating a JFET and a trench MOSFET according to an embodiment of the present invention.

FIG. 4 illustrates a cross-sectional view of a semiconductor device 400 integrating a JFET and a trench MOSFET according to an embodiment of the present invention.

The semiconductor device 400 comprises a JFET 400*a* and a trench MOSFET 400*b*. The JFET 400*a* and the trench MOSFET 400*b* are both vertical devices. In a preferred embodiment, a trench gate without applying a bias voltage is used to electrically isolate the JFET 400*a* from the trench MOSFET 400*b*, and thereby a process for forming extra shallow trench isolation (STI) is no needed. The JFET 400*a* and the trench MOSFET 400*b* share the N+ drain region 401 functioning as a semiconductor substrate, the N− epitaxial layer 402 and the ILDL 406.

The JFET 400*a* shown in FIG. 4 is same with the JFET 200 shown in FIG. 2. The trench MOSFET 400*b* may be configured in any conventional structure. The trench MOSFET 400*b* comprises a P body region 403*b* formed in the N− epitaxial layer 402, an N+ source region 404*b* formed in the P body region 403*b*, a P+ doped region 405*b* formed in the P body region 405*b* under the N+ source region 404*b*. There is no direct contact between the N+ soured region 404*b* and the P+ doped region 405*b*. A source contact 408*b* extends through the ILDL 406 into the P+ doped region 405*b* and provides electrical connection with the N+ source region 404*b* as well as the P+ doped region 405*b*.

The trench MOSFET 400*b* further comprises a trench. The trench extends through the N+ source region 404*b* and the P body region 403*b* into the N− epitaxial layer 402. A gate dielectric layer 410 is formed on the sidewalls of the trench, and the trench is filled with gate conductor 411 such as doped polysilicon. The gate dielectric layer 410 comprises insulation material such as HfO2. The gate contact 412 extends through the ILDL 406 and provides electrical connection to the gate conductor 411. The gate conductor 411 is also called trench gate.

When a bias voltage is applied to the gate contact 412, the current flowing through the conductive path formed between the source region 404*b* and the drain region 401 is controllable.

In the embodiment shown in FIG. 4, the P body region 403*a*, P+ doped region 405*a*, N+ source region 404*a* and the gate contact 408*a* of the JFET 400*a* may respectively share the same masks at the same processing steps with the P body region 403*b*, P+ doped region 405*b*, N+ source region 404*b* and the source contact 408*b* of the trench MOSFET 400*b*. The trench gate (411) of the JFET 400*b* may share the same mask at the same processing step with the trench gate which is used to isolate the JFET 400*a* from the trench MOSFET 400*b*. The difference between these two trench gates is that a bias voltage is applied to the former one but the latter one is generally floating.

As shown in FIG. 4, the semiconductor device 400 further comprises a termination structure near the JFET 400*a*. The termination structure comprises at least one trench gate used for isolation. However, one skilled in the art should understand that the termination may comprise other known structure such as STI.

Figure 5:
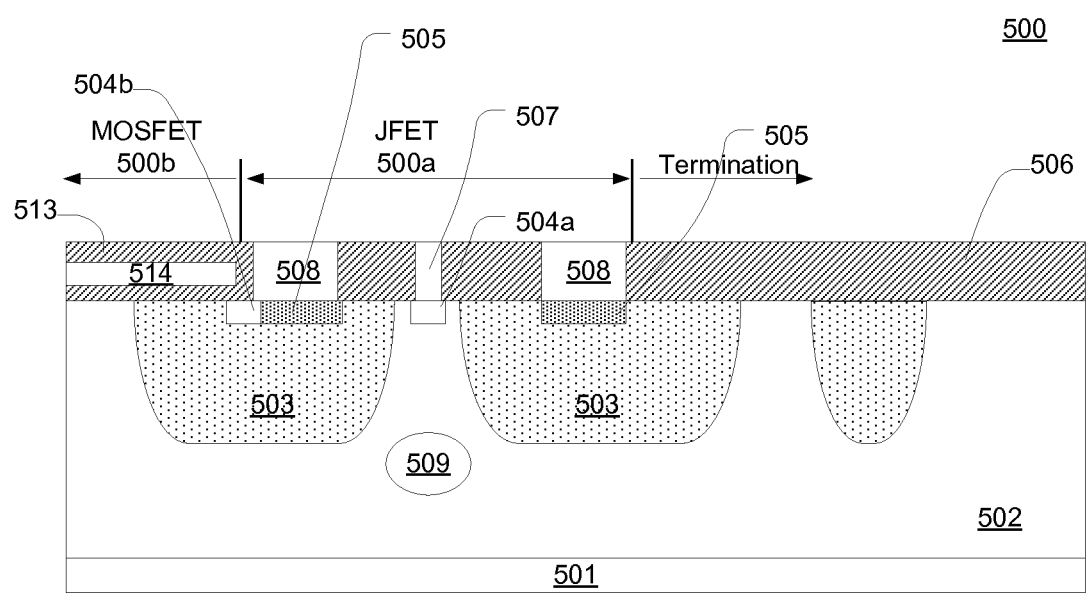
FIG. 5 illustrates a cross-sectional view of a semiconductor device 500 integrating a JFET and a planar MOSFET according to an embodiment of the present invention.

FIG. 5 illustrates a cross-sectional view of a semiconductor device 500 integrating a JFET and a planar MOSFET according to an embodiment of the present invention.

The semiconductor 500 comprises a JFET 500*a* and a planar MOSFET 500*b*. The JFET 500*a* is a vertical device and the planar MOSFET 500*b* is a planar device. As shown in FIG. 5, the JFET 500*a* and the planar 500*b* may be directly connected according to the requirement of design. The gate contact 508 of the JFET 500*a* is directly connected to the region 504*b* of the planar MOSFET 500*b*. As an alternative, a STI may be used to isolate the JFET 500*a* from the planar MOSFET 500*b*. The JFET 500*a* and the planar MOSFET 500*b* may share the semiconductor substrate 501 functioning as the N+ drain region of the JFET 500*a*, the N− epitaxial layer 502, the P body region 503, the ILDL 506 and the gate contact 508.

The JFET 500*a* shown in FIG. 5 is same with the JFET 200 shown in FIG. 2. FIG. 5 only shows a part of the planar MOSFET 500*b* to simply describe the relationship between the JFET 500*a* and the planar MOSFET 500*b*. For example, only part of the channel region and one of the source region and drain region of the planar MOSFET 500*b* are shown. The planar MOSFET 500*b* shown in FIG. 5 comprises an N+ region 504*b* (source region or drain region) formed in the P body region 503. The N+ region 504*b* of the planar MOSFET 500*b* is beside the gate region 505 of the JFET 500*a*. The gate contact 508 of the JFET 500*a* provides direct electrical connection between the N+ region 504*b* of the planar MOSFET 500*b* and the P+ gate region 505 of the JFET 500*a*. The planar MOSFET 500*b* further comprises a gate dielectric layer 513 and a gate conductor 514 formed above the P body region 503, wherein the gate dielectric layer 513 isolates the gate conductor 514 from the channel region and the P body region 503. Although not shown in FIG. 5, the planar MOSFET 500*b* further comprises another N+ region (drain region or source region).

When a bias voltage is applied to the gate conductor 514, the current flowing through the channel region of the planar MOSFET 500*b* is controllable.

In the embodiment shown in FIG. 5, the N+ source region 504*a* of the JFET 500*a* may share the same mask at the same processing step with the N+ region 504*b* of the planar MOSFET 500*b*.

As shown in FIG. 5, the semiconductor device 500 further comprises a termination structure near the JFET 500*a*. The termination structure may comprise any known structure such as STI.

Figure 6:
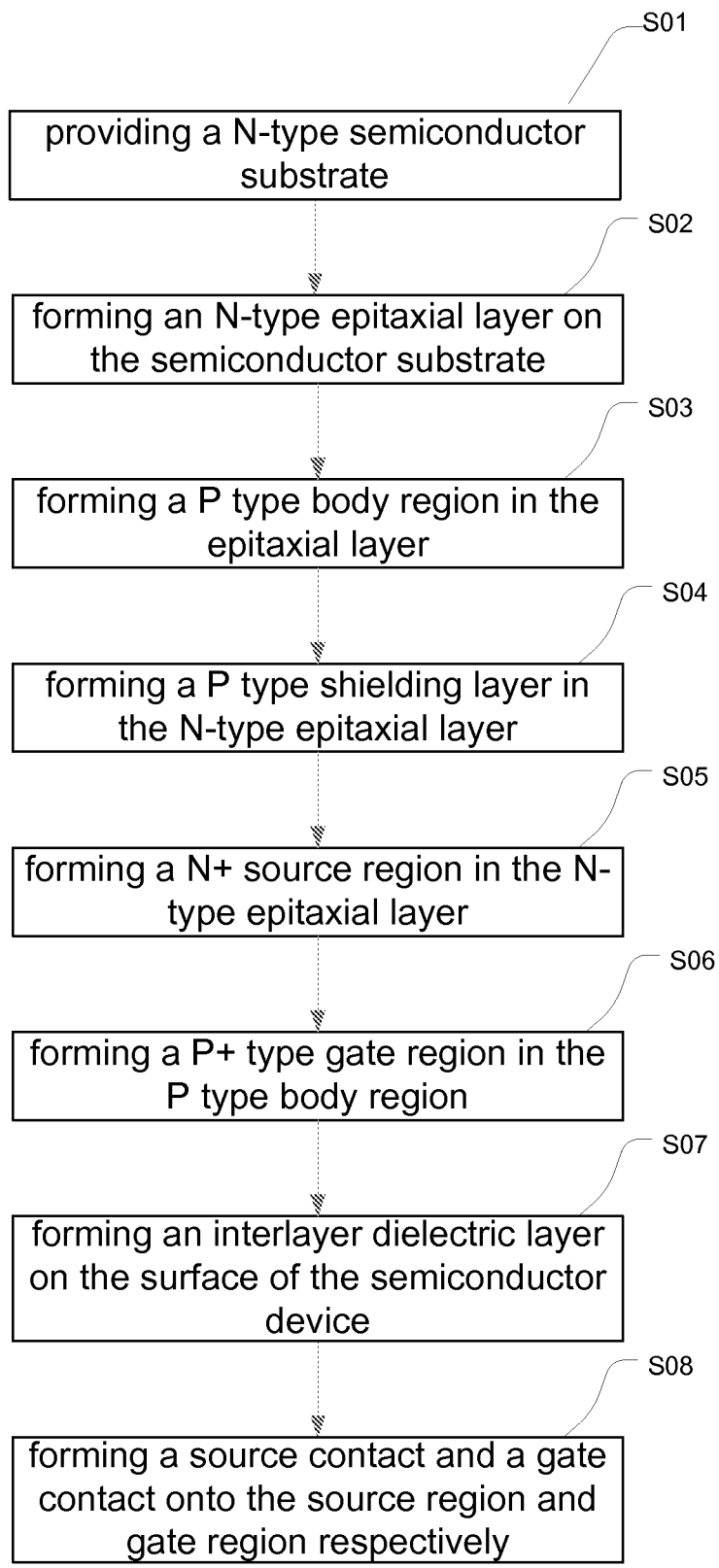
FIG. 6 schematically illustrates a flow chart of a fabrication method for forming a JFET according to an embodiment of the present invention.

FIG. 6 schematically illustrates a flow chart of a fabrication method for forming a JFET according to an embodiment of the present invention. As shown in FIG. 6, the fabrication method comprises steps S01~S07. One skilled in the art will also understand that many details of steps, process, technological parameter and other features are merely illustrative of particular embodiments of the technology, various modifications of the details may be made according to the practical applications. In other embodiments, the method may include more or less steps than those described below.

Step S01: an N+ semiconductor substrate functioning as the N+ drain region 201 of the JFET 200 is provided. In one embodiment, the N+ semiconductor substrate comprises mono-silicon substrate doped with N type dopants. Any method known in the art may be used to deposit the semiconductor substrate, such as pulsed laser deposition (PLD), molecular beam epitaxy (MBE), chemical vapor deposition (CVD), etc.

Step S02: an N− epitaxial layer 202 is formed on the N+ semiconductor substrate. The N− epitaxial layer 202 can be formed by in-situ implantation. In another embodiment, after forming an epitaxial layer, ion implantation is performed and N type dopants are implanted into the epitaxial layer to form the N− epitaxial layer 202.

Step S03: a first photoresist mask with opening is formed onto the N− epitaxial layer 202, and then P type dopants are implanted into the N− epitaxial layer 202 through the opening of the first photoresist mask to form a P body region 203. In one embodiment, the center of the active area is not exposed through the opening of the first photoresist mask, and thereby the P body region 203 is an annular region surrounding a part of N− epitaxial layer 202. As would be known to one skilled in the art, the implant depth, doping profile and doping concentration may be controlled through adjusting the parameters of the ion implantation. The P body region 203 extends down from the top surface of the N− epitaxial layer 202 to a certain depth adjacent the N+ drain region 201. Then the first photoresist mask is removed via stripping or dissolving.

Step S04: a second photoresist mask with opening is then formed onto the N− epitaxial layer 202. In a preferred embodiment, the opening of the second photoresist mask and that of the first photoresist mask are complementary. In one embodiment, the center of the active area is exposed through the opening of the second photoresist mask. P type dopants are implanted into the N− epitaxial layer 202 through the opening of the second photoresist mask to form a P shielding layer 209. The depth of the P shielding layer can be controlled by adjusting the parameters of the ion implantation. Then the second photoresist mask is removed.

Step S05: an N+ source region 204 is formed in the N− epitaxial layer 202 by known methods, e.g. the ion implantation as described above. The N+ source region 204 extends down from the top surface of the N− epitaxial layer 202 to a certain depth. The N+ source region 204 is above the P shielding layer 209.

Step S06: a P+ gate region 205 is formed in the P body region 203 by known methods, e.g. the ion implantation as described above. The P+ gate region 205 extends down from the surface of the P body region 203 to a certain depth.

Step S07: an ILDL 206 is deposited onto the surface of the semiconductor device. In some embodiments, the ILDL 206 may be silicon oxide or any other oxide of the substrate material. During the process, the oxide used to form ILDL 206 may be deposited too much. Any technique known in the art may be used to remove extra oxide, such as chemical mechanical polish (CMP). Then the ILDL 206 is patterned to form through-vias that respectively extend through the ILDL 206 into the N+ source region 204 and P+ gate region 205. The patterning process comprises forming a photoresist mask with opening on the ILDL 206. The portion exposed through the opening of the photoresist mask is etched such that the through-vias are formed. Any etching technique as known in the art may be used, such as dry etching and wet etching.

Step S08: mental material such as tungsten is deposited into the through-vias to form a source contact 207 and a gate contact 208. In one embodiment, the surface planarization of the semiconductor device is accomplished by the etching technique CMP or any other technique known in the art.

The above embodiments take n-channel device as example, however, by change the doping types of the semiconductor regions, the embodiments of the present invention may also be applied in p-channel devices. The structures and methods of forming a semiconductor device including a JFET are therefore applicable to both N-channel and P-channel devices.

The above description and discussion about specific embodiments of the present invention is for purposes of illustration. However, one with ordinary skill in the relevant art should know that the invention is not limited by the specific examples disclosed herein. Variations and modifications can be made on the apparatus, methods and technical design described above. Accordingly, the invention should be viewed as limited solely by the scope and spirit of the appended claims.

We claim:

1. A junction field effect transistor, comprising:
    a semiconductor substrate of a first doping type, wherein the semiconductor substrate is configured as a drain region;
    an epitaxial layer of the first doping type located on the semiconductor substrate;
    a body region of a second doping type located in the epitaxial layer, wherein the second doping type is different from the first doping type;
    a source region of the first doping type located in the epitaxial layer;
    a gate region of the second doping type located in the body region; and
    a shielding layer of the second doping type located in the epitaxial layer, wherein the shielding layer is in a conductive path formed between the source region and the drain region; and wherein
    the shielding layer is in complementary pattern to the body region.

2. The junction field effect transistor of claim 1, wherein a pinch-off region is formed by a part of the epitaxial layer located between the body region and the shielding layer.

3. The junction field effect transistor of claim 1, wherein the source region is surrounded by the body region.

4. The junction field effect transistor of claim 1, wherein the cross-sectional profile of the shielding layer is same with the top-sectional profile of the conductive path.

5. The junction field effect transistor of claim 1, further comprising:
    a trench gate located in the epitaxial layer, wherein the source region is located between the body region and the trench gate; and
    a gate dielectric layer configured to isolate the trench gate from the epitaxial layer.

6. The junction field effect transistor of claim 5, wherein a pinch-off region is formed by a part of the epitaxial layer located between the trench gate and the shielding layer.

7. The junction field effect transistor of claim 1, wherein the shielding layer is at least partially above the bottom of the body region.

8. A method for fabricating a junction field effect transistor, comprising:
    providing a semiconductor substrate of a first doping type, wherein the semiconductor substrate is configured as a drain region;
    forming an epitaxial layer of the first doping type on the semiconductor substrate;
    forming a body region of a second doping type in the epitaxial layer, wherein the second doping type is different from the first doping type;
    forming a shielding layer of the second doping type in the epitaxial layer;
    forming a source region in the epitaxial layer, wherein the source region is doped with the first doping type;

forming a gate region in the body region, wherein the gate region is doped with the second doping type; and wherein the shielding layer is located in a conductive path formed between the source region and the drain region; and wherein the shielding layer is in complementary pattern to the body region.

9. The method of claim 8, further comprising:

forming a trench in the epitaxial layer;

forming a gate dielectric layer on the sidewalls of the trench;

filling the trench with gate conductor to form a trench gate;

wherein the source region is located between the body region and the trench gate.

10. The method of claim 8, wherein the source region is surrounded by the body region.

11. The method of claim 8, wherein the shielding layer is at least partially above the bottom of the body region.

12. A semiconductor device including a junction field effect transistor (JFET), comprising:

a semiconductor substrate of a first doping type, wherein the semiconductor substrate is configured as a drain region of the JFET;

an epitaxial layer of the first doping type located on the semiconductor substrate;

a body region of a second doping type located in the epitaxial layer, wherein the second doping type is different from the first doping type;

a source region of the JFET, wherein the source region is located in the epitaxial layer and doped with the first doping type;

a gate region of the JFET, wherein the gate region is located in the body region and doped with the second doping type; and a shielding layer of the second doping type located in the epitaxial layer, wherein the shielding layer is in a conductive path formed between the source region and the drain region of the JFET; and wherein the shielding layer is in complementary pattern to the body region.

13. The semiconductor device of claim 12, wherein a pinch-off region is formed by a part of the epitaxial layer located between the body region and the shielding layer.

14. The semiconductor device of claim 12, wherein the source region of the JFET is surrounded by the body region.

15. The semiconductor device of claim 12, wherein the cross-sectional profile of the shielding layer is same with the top-sectional profile of the conductive path.

16. The semiconductor device according of claim 12, further comprising:

a trench gate located in the epitaxial layer, wherein the source region of the JFET is located between the body region and the trench gate; and a gate dielectric layer configured to isolate the trench gate from the epitaxial layer.

17. The semiconductor device of claim 16, wherein a pinch-off region is formed by a part of the epitaxial layer located between the trench gate of the JFET and the shielding layer.

18. The semiconductor device of claim 12, wherein the shielding layer is at least partially above the bottom of the body region.

19. The semiconductor device of claim 12, further comprising a trench MOSFET, wherein the semiconductor substrate is configured as a drain region of the trench MOSFET, and the semiconductor device further comprises:

a source region of the trench MOSFET, wherein the source region is located in the body region and is doped with the first doping type;

a trench gate, wherein the trench gate extends through the source region of the trench MOSFET and the body region into the epitaxial layer; and a gate dielectric layer separating the trench gate from the source region of the trench MOSFET, the body region and the epitaxial layer.

20. The semiconductor device of claim 12, further comprising a planar MOSFET, wherein the semiconductor device further comprises:

a source region and a drain region of the planar MOSFET, wherein the source region and the drain region are located in the body region and doped with the first doping type;

a gate conductor located above the epitaxial layer between the source region and the drain region of the planar MOSFET; and a gate dielectric layer located separating the gate conductor from the epitaxial layer.

* * * * *